United States Patent
Blomqvist et al.

(10) Patent No.: US 9,452,921 B2
(45) Date of Patent: Sep. 27, 2016

(54) GYROSCOPE STRUCTURE AND GYROSCOPE

(71) Applicant: MURATA MANUFACTURING CO., LTD., Nagaokakyo-shi, Kyoto (JP)

(72) Inventors: Anssi Blomqvist, Helsinki (FI); Jaakko Ruohio, Helsinki (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 235 days.

(21) Appl. No.: 14/480,730

(22) Filed: Sep. 9, 2014

(65) Prior Publication Data

US 2015/0068308 A1 Mar. 12, 2015

(30) Foreign Application Priority Data

Sep. 11, 2013 (FI) .................................... 20135915

(51) Int. Cl.
*B41B 7/00* (2006.01)
*G01C 19/5712* (2012.01)
*B81B 7/00* (2006.01)

(52) U.S. Cl.
CPC ......... *B81B 7/0058* (2013.01); *G01C 19/5712* (2013.01); *B81B 2201/0242* (2013.01)

(58) Field of Classification Search
CPC .................... B81B 7/0058; B81B 2201/0242; G01C 19/5712
See application file for complete search history.

(56) References Cited

U.S. PATENT DOCUMENTS

| | | | |
|---|---|---|---|
| 5,869,760 A | 2/1999 | Geen | |
| 5,992,233 A * | 11/1999 | Clark | G01C 19/5719 361/280 |
| 6,257,057 B1 * | 7/2001 | Hulsing, II | G01C 19/5719 73/504.04 |
| 6,508,122 B1 * | 1/2003 | McCall | G01C 19/5719 702/147 |
| 7,036,372 B2 * | 5/2006 | Chojnacki | G01C 19/5747 73/504.12 |
| 7,213,458 B2 * | 5/2007 | Weber | G01C 19/5719 73/504.12 |
| 7,287,428 B2 * | 10/2007 | Green | G01C 19/574 73/504.12 |
| 8,047,075 B2 * | 11/2011 | Nasiri | G01P 15/125 73/510 |
| 8,850,886 B2 * | 10/2014 | Kempe | G01C 19/574 73/504.04 |

(Continued)

FOREIGN PATENT DOCUMENTS

| | | | |
|---|---|---|---|
| EP | 2378246 A1 | 10/2011 | |
| EP | 2607850 A2 | 6/2013 | |

OTHER PUBLICATIONS

Finnish Search Report dated Apr. 28, 2014 corresponding to Finnish Patent Application No. 20135915.

(Continued)

*Primary Examiner* — David Bolduc
(74) *Attorney, Agent, or Firm* — Squire Patton Boggs (US) LLP

(57) ABSTRACT

A microelectromechanical gyroscope that comprises two seismic masses suspended to form a plane of masses. The seismic masses are excited into rotary oscillation about a common primary axis that is in the plane of masses. Detected angular motion causes a rotary oscillation of the first seismic mass about a first detection axis, and of the second seismic mass about a second detection axis. The detection axes are perpendicular to the plane of masses and separated by a non-zero distance.

24 Claims, 2 Drawing Sheets

(56) References Cited

U.S. PATENT DOCUMENTS

| | | | |
|---|---|---|---|
| 2002/0189353 A1* | 12/2002 | Knowles | G01C 19/5719 73/504.12 |
| 2002/0189354 A1* | 12/2002 | Durante | G01C 19/5747 73/504.12 |
| 2003/0037614 A1* | 2/2003 | Nguyen | G01P 15/0802 73/504.14 |
| 2004/0149035 A1* | 8/2004 | Acar | B81B 3/0062 73/504.12 |
| 2004/0154398 A1* | 8/2004 | Willig | G01C 19/5747 73/504.12 |
| 2005/0150297 A1* | 7/2005 | Ayazi | G01C 19/5719 73/504.16 |
| 2006/0032309 A1* | 2/2006 | Caminada | G01C 19/5726 73/514.18 |
| 2006/0037396 A1* | 2/2006 | Nicu | G01C 19/5747 73/504.12 |
| 2006/0156813 A1* | 7/2006 | Blomqvist | G01C 19/5712 73/504.12 |
| 2006/0156814 A1 | 7/2006 | Blomqvist | |
| 2006/0272411 A1 | 12/2006 | Acar et al. | |
| 2008/0092652 A1 | 4/2008 | Acar et al. | |
| 2009/0260437 A1* | 10/2009 | Blomqvist | G01C 19/5712 73/504.12 |
| 2010/0139399 A1* | 6/2010 | Geiger | G01C 19/574 73/504.12 |
| 2010/0307241 A1* | 12/2010 | Raman | G01C 19/56 73/504.12 |
| 2011/0041601 A1 | 2/2011 | Hsu et al. | |
| 2011/0154898 A1* | 6/2011 | Cazzaniga | G01C 19/5747 73/504.12 |
| 2012/0055248 A1* | 3/2012 | Hammer | G01C 19/5712 73/504.12 |
| 2012/0216612 A1* | 8/2012 | Seeger | G01C 19/5719 73/504.12 |
| 2013/0019680 A1* | 1/2013 | Kittilsland | G01C 19/5712 73/504.12 |
| 2013/0192363 A1 | 8/2013 | Loreck et al. | |
| 2013/0269469 A1* | 10/2013 | Rocchi | G01C 19/04 74/5 F |
| 2013/0283908 A1* | 10/2013 | Geen | G01C 19/574 73/504.12 |
| 2014/0090469 A1* | 4/2014 | Comi | G01P 15/097 73/504.12 |
| 2014/0144232 A1* | 5/2014 | Lin | B81B 3/0051 73/504.12 |
| 2015/0059473 A1* | 3/2015 | Jia | G01C 19/5747 73/504.12 |
| 2015/0330783 A1* | 11/2015 | Rocchi | G01C 19/5769 73/504.12 |

OTHER PUBLICATIONS

International Search Report application No. PCT/IB2014/064376 mailed Dec. 16, 2014.

* cited by examiner

GYROSCOPE STRUCTURE AND GYROSCOPE

BACKGROUND

1. Field

The present invention relates to microelectromechanical devices and especially to a gyroscope structure and a gyroscope, as defined in the preambles of the independent claims.

2. Description of the Related Art

Micro-Electro-Mechanical Systems, or MEMS can be defined as miniaturized mechanical and electro-mechanical systems where at least some elements have a mechanical functionality. Since MEMS devices are created with the same tools used to create integrated circuits, micromachines and microelectronics can be fabricated on the same piece of silicon to enable advanced devices.

MEMS structures can be applied to quickly and accurately detect very small changes in physical properties. For example, a microelectromechanical gyroscope can be applied to quickly and accurately detect very small angular displacements. Motion has six degrees of freedom: translations in three orthogonal directions and rotations around three orthogonal axes. The latter three may be measured by an angular rate sensor, also known as a gyroscope. MEMS gyroscopes use the Coriolis Effect to measure the angular rate. When a mass is moving in one direction and rotational angular velocity is applied, the mass experiences a force in orthogonal direction as a result of the Coriolis force. The resulting physical displacement caused by the Coriolis force may then be read from, for example, a capacitively, piezoelectrically or piezoresistively sensing structure.

In MEMS gyros the primary motion is typically not continuous rotation as in conventional ones due to lack of adequate bearings. Instead, mechanical oscillation may be used as the primary motion. When an oscillating gyroscope is subjected to an angular motion orthogonal to the direction of the primary motion, an undulating Coriolis force results. This creates a secondary oscillation orthogonal to the primary motion and to the axis of the angular motion, and at the frequency of the primary oscillation. The amplitude of this coupled oscillation can be used as the measure of the angular rate.

Gyroscopes are very complex inertial MEMS sensors. The basic challenge in gyroscope designs is that the Coriolis force is very small and therefore the generated signals tend to be minuscule compared to other electrical signals present in the gyroscope. Spurious responses and susceptibility to vibration plague many MEMS gyro designs.

In an advanced prior art MEMS gyro design, an external applied angular velocity is configured to induce to two parallelly positioned planar seismic masses an opposite phase motion about a common axis of rotation. This motion can be detected with electrodes positioned above the plane of the seismic masses. With the explicit oscillation directions of the specific prior art configuration, the primary mode oscillation and the detection mode oscillation are effectively kept apart so that a robust sensor structure that is highly insensitive to external shocks has been provided.

Typically a cover or cap, fixed to the substrate or to a functional layer, encases the MEMS gyroscope structure, forming a casing that protects the MEMS gyroscope against external conditions. The challenge with MEMS is, however, to provide environmental protection that does not restrict movement of the mobile parts of the structure. For example, in the above prior art structure, the seismic masses and the excitation structures are in a structure wafer that is enclosed between a handle wafer and a cap wafer. Traditional accelerometers and gyroscopes have been considered as one of the easiest MEMS packages because they have no mechanical contact with outside world. However, in the above prior art gyroscope structure, the sensing electrodes have been patterned to the cap wafer. This makes the structure more vulnerable to deviations from the designed dimensions and increases complexity of the sensor packaging, since traditional epoxy overmolding processes cannot be used.

SUMMARY

The object of the present invention is to design a gyroscope structure that provides an achieved improved level of accuracy and insensitivity to external shocks but is less sensitive to deviations from the designed dimensions. The objects of the present invention are achieved with a gyroscope structure according to the characterizing portions of the independent claims.

The claims define a microelectromechanical gyroscope structure that comprises a planar first seismic mass, a planar second seismic mass, and a first spring structure for suspending the first seismic mass and the second seismic mass on an another body element in a parallel position, wherein the plane of the first seismic mass and the plane of the second seismic mass form a reference plane of masses. The microelectromechanical gyroscope structure comprises also excitation means, and detection means. The first spring structure includes a first anchor point within the plane of the first seismic mass for attaching the first seismic mass to the other body element, and a first spring assembly attached to the first anchor point and the first seismic mass, which first spring assembly enables rotary oscillation of the first seismic mass about a first excitation axis in the plane of masses. The first spring structure includes a second anchor point within the plane of the second seismic mass for attaching the second seismic mass to the other body element, and a second spring assembly attached to the second anchor point and the second seismic mass, which second spring assembly enables rotary oscillation of the second seismic mass about a second excitation axis in the plane of masses. The first excitation axis and the second excitation axis are aligned to a common primary axis.

The first spring assembly enables also rotary oscillation of the first seismic mass about a first detection axis that is perpendicular to the plane of masses, and the second spring assembly enables also rotary oscillation of the second seismic mass about a second detection axis that is perpendicular to the plane of masses. The first detection axis and the second detection axis are separated by a non-zero distance The excitation means are configured to drive the first seismic mass and the second seismic mass to oscillate about the common primary axis. The detection means are configured to detect the rotary oscillation of the first seismic mass about the first detection axis and the rotary oscillation of the second seismic mass about the second detection axis.

The detection means include at least one detector element with an in-plane detection comb that comprises a stator comb and a rotor comb. The detection means also include a second spring structure for transforming the rotary oscillation of the first seismic mass or of the second seismic mass into linear oscillation of the in-plane detection comb in the plane of masses in a direction parallel to the common primary axis.

The claims define also a gyroscope that includes the microelectromechanical gyroscope structure. The preferred embodiments of the invention are disclosed in the dependent claims.

The present invention is based on applying a new combination of primary motion and secondary motion modes of two planar seismic masses. In the primary motion, the seismic masses are excited to an opposite phase rotary oscillation about a common primary axis. A secondary motion of each of the seismic masses includes in-plane rotary oscillation about a detection axis that is perpendicular to the plane formed by the seismic masses. The detection axes of the two seismic masses are thus parallel but separated by a distance. The rotary in-plane movement of the seismic masses is transformed into linear oscillation that is detected with capacitive comb structures, the operation of which is less sensitive to deformations caused by the packaging process or by environmental changes to the package. The linear oscillation of the sense mode enables higher signal level, and easier implementation for the system.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of gyroscope structures that are generally known to a person skilled in the art may not be specifically described herein.

Figure 1:
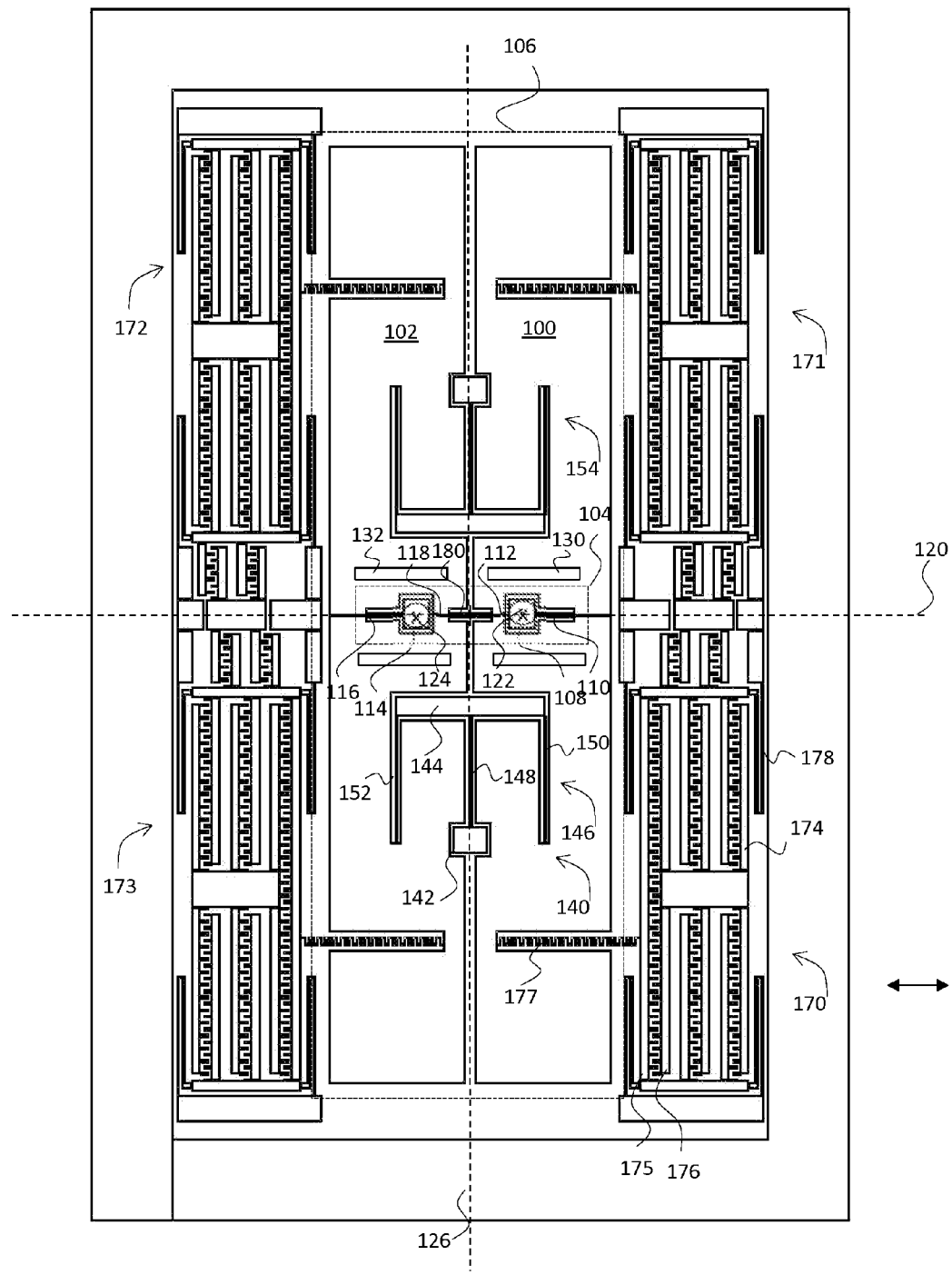
FIG. 1 illustrates an embodiment of a gyroscope structure.

FIG. 1 illustrates an embodiment of a gyroscope structure according to the present invention with elements of a structure wafer of a MEMS gyroscope. The gyroscope structure includes a first seismic mass 100 and a second seismic mass 102. The term seismic mass refers here to a mass body that may be suspended to a base to provide an inertial movement. The first seismic mass 100 and the second seismic mass 102 may have a planar form. This means that at least part of the volume of the seismic masses 100, 102 extends along a plane in two dimensions (length, width) and forms therein a planar surface. Within tolerances, the planar surface of the seismic mass 100, 102 can be considered to contain all straight lines that connect any two points on it. It is, however, understood that the surface may include minor protrusions patterned on the seismic mass, or recesses patterned into the seismic mass.

The gyroscope structure includes also a first spring structure 104 for suspending the first seismic mass 100 and the second seismic mass 102 to another body element of the gyroscope. The other body element may be provided, for example, by an underlying handle wafer, or a covering cap wafer of a gyroscope die. It is noted that the divisions to a structure wafer, the handle wafer and the cap wafer are conceptual. For a person skilled in the art it is clear, for example, that the handle wafer and the structure wafer may be patterned separately or in combination from a layered silicon-insulator-silicon substrate. The first spring structure 104 may be configured to suspend the first seismic mass 100 and the second seismic mass 102 into a parallel position such that the planar surfaces of the first seismic mass 100 and the second seismic mass 102 form a plane of masses 106. The plane of masses 106 is thus a reference plane formed by the planar surfaces of the seismic masses 100, 102 suspended at their initial designed position, when no added external forces act upon them. It is understood that under varying conditions and during operation of the gyroscope, the seismic masses, as such, may later move and deform out of the plane of masses 106.

As shown in FIG. 1, the elements of the first spring structure 104 are advantageously patterned into the volumes of the first seismic mass 100 and the second seismic mass 102. The first spring structure 104 may include a first anchor point 108 within the plane of the first seismic mass 100. The first anchor point 108 refers to an element suitable for attaching the first seismic mass 100 to another body element of the gyroscope, for example to an underlying substrate and/or to a covering cap. The first anchor point 108 may be, for example, a region patterned into the volume of the first seismic mass 100 by removing a material of the seismic mass from the perimeter of the region of the first anchor point 108. The first spring structure 104 may include also a first spring assembly 110 attached to the first anchor point 108 and the first seismic mass 100. The first spring assembly 110 may be configured to enable rotary oscillation of the first seismic mass 100 about a first excitation axis 112 that is in the plane of masses 106. The first spring assembly 110 may include, for example, a first beam-formed spring patterned into the plane of the first seismic mass 100 to extend between the first anchor point 108 and the first seismic mass 100. When the first seismic mass 100 during operation oscillates about the first excitation axis 112, the beam-formed spring may twist torsionally between the first anchor point 108 and the first seismic mass 100.

Correspondingly, the first spring structure 104 may include a second anchor point 114 within the plane of the second seismic mass 102. The second anchor point 114 refers to an element suitable for attaching the second seismic mass 102 to another body element, for example to an underlying substrate and/or to a covering cap. The second anchor point 114 may also be, for example, a region patterned into the volume of the second seismic mass 102 by removing a material of the seismic mass from the perimeter of the region of the second anchor point 114. The first spring structure 104 may include also a second spring assembly 116 attached to the second anchor point 114 and the second seismic mass 102. The second spring assembly 116 may be configured to enable rotary oscillation of the second seismic mass 102 about a second excitation axis 118 that is in the plane of masses 106. The second spring assembly 116 may include, for example, a second beam-formed spring patterned into the plane of the second seismic mass 102 to extend between the second anchor point 114 and the second seismic mass 102. When the second seismic mass 102 during operation oscillates about the second excitation axis 118, the beam-formed spring may twist torsionally between the second anchor point 114 and the second seismic mass 102.

It is noted that the beam-formed spring is only an exemplary structure for the first and second spring assemblies. Other forms may be applied within the scope. For example, a circumferential spring structure surrounding a respective anchor point may be applied for the purpose, as well.

As shown in FIG. 1, the first excitation axis 112 and the second excitation axis 118 are aligned to form a common primary axis 120. The common primary axis 120 may traverse the first anchor point 108 and the second anchor point 114 such that the primary movement includes seesaw type of movement of opposite ends of the seismic masses in relation to the common primary axis 120.

In the first spring structure 104, the first spring assembly 110 enables also rotary oscillation of the first seismic mass 100 about a first detection axis 122 that crosses the plane of the first seismic mass 100 and is perpendicular to the plane of masses 106. Correspondingly, the second spring assembly 116 enables also rotary oscillation of the second seismic mass 102 about a second detection axis 124 that is perpendicular to the plane of masses 106. In the exemplary case of beam-formed springs, the beam spring may undergo in-plane bending and thereby facilitates the in-plane rotary oscillation of the respective seismic mass. The first detection axis 122 and the second detection axis 124 are separated from each other by a non-zero distance. Advantageously the detection axes 122, 124 are symmetrically positioned in respect of a centerline 126 between the seismic masses 100, 102.

The sensor structure includes also first excitation means 130, 132 that are configured to drive the first seismic mass 100 and the second seismic mass 102 to oscillate about the common primary axis 120. The first excitation means may include a first mass electrode 130 that is configured to move with the first seismic mass 100, and a second mass electrode 132 that is configured to move with the second seismic mass 102. The electrodes 130, 132 may interact electrically with an electrode or electrodes attached to the cap or the substrate, and as a result of this electrical interaction induce their respective seismic masses 100, 102 into rotary oscillation about the common primary axis 120.

In FIG. 1, the exemplary first excitation means are shown to comprise four electrode layer regions positioned symmetrically on the planes of the seismic masses 100, 102. It is understood that other positions and other excitation structures capable of creating the specified out-of-plane directed excitation force to a seismic mass may be applied within the scope. For example, each of the seismic masses may be excited with one electrode region, positioned either on the seismic mass or on the other body part. A seismic mass may itself be formed of conductive material, or include a deposited layer of conductive material and be made to interact with a stator electrode inside the cap or on the underlying substrate. Also piezoelectrical excitation may be applied by e.g. a piezoelectric film deposited on top of the layer forming the springs. Other corresponding out-of-plane excitation structures are well known to a person skilled in the art, and will not be discussed in detail herein.

In order to mechanically balance the excitation mode oscillation, and thereby cancel external mechanical interference caused by, for example, shocks or vibration, the rotary oscillation of the first seismic mass 100 and the rotary oscillation of the second seismic mass 102 may be coupled into anti-phase movement. Anti-phase movement refers here to oscillatory motion of two seismic masses, wherein the seismic masses oscillate with the same frequency, but in different phases. Advantageously, the seismic masses oscillate in opposite phases.

The anti-phase coupling may be enhanced by a phasing spring structure 140 that is connected to the first seismic mass 100 and to the second seismic mass 102. Advantageously, the phasing spring structure 140 is a region patterned into the volume of the first seismic mass and the second seismic mass. Let us assume that the common primary axis 120 divides the first seismic mass 100 and the second seismic mass 102 into two parts. In an exemplary anti-phase movement, the coupling of the phasing spring structure 140 is arranged to move a part of the first seismic mass 100 in one side of the common primary axis in one direction (up), when a part of the second seismic mass 102 in the same side of the common primary axis 120 moves to an opposite direction (down).

In the exemplary configuration of FIG. 1, the phasing spring structure 140 may include a third anchor point 142, and an essentially rigid beam 144, interconnected by a third spring assembly 146. The third spring assembly 146 may include a center spring 148 connecting the third anchor point 142 and a centre point of the rigid beam 144, a first end spring 150 connecting a first end of the beam 144 to the first seismic mass 100, and a second end spring 152 connecting a second end of the beam 144 to the second seismic mass 102. The first end spring 150 may be configured to be rigid in a direction of the plane of masses 106, and to be flexible in the direction perpendicular to the plane of masses 106. This couples movements of the first end of the beam 144 essentially rigidly to movements of the first seismic mass 100, and at the same time enables the see-saw type of movement of the beam 144 during the rotary oscillation of the first seismic mass 100. Correspondingly, the second end spring 152 may be configured to be rigid in a direction of the plane of masses 106 and to be flexible in the direction perpendicular to the plane of masses 106. This couples movements of the second end of the beam 144 essentially rigidly to movements of the second seismic mass 102, and at the same time enables the see-saw type of movement of the beam 144 during the rotary oscillation of the second seismic mass 102.

The phasing spring structure 140 thus ensures that an end of the first seismic mass 100 and an end of the second seismic mass on one side of the common primary axis 120 move to opposite directions, and thereby forces the rotary oscillation of the primary mode movement into an anti-phase mode.

Advantageously, the gyroscope structure may comprise more than one phasing spring structures 140. For example, the gyroscope structure of FIG. 1 includes two phasing spring structures 140, 154 symmetrically positioned in opposite sides of the common primary axis 120. The beam 144 is advantageously parallel to the common primary axis 120.

The seismic masses 100, 102 may be connected to each other by a coupling spring 180. The coupling spring 180 is advantageously configured to twist along the common primary axis 120 under the rotary oscillations of the seismic masses 100, 102 in the primary motion, and to bend in the plane of masses 106 under the rotary oscillations of the seismic masses 100,102 in the secondary motion. The coupling spring 180 thereby couples the detected motions of the seismic masses into the anti-phase differential mode that rejects common-mode deflection of the masses, caused by external angular shocks. The coupling thus ensures exceptionally stable operation even in mechanically harsh environments.

As discussed earlier, the secondary motion that corresponds with the detected angular motion takes place in the direction of the plane of masses 106. Detection of motion in this direction may then be implemented with comb structures that are inherently quite stable and offer various ways to deal with mechanical deformations due to package induced stresses.

The detection means may include at least one detector element 170, 171, 172, 173, and it is configured to detect the rotary oscillation of the first seismic mass 100 about the first detection axis 122 and the rotary oscillation of the second seismic mass 102 about the second detection axis 124. For optimized size of the gyroscope element, at least two separate detector elements 170, 173 or 171,172 on opposite sides of the plane of masses 106 may be provided. For differential detection mode that allows canceling of external mechanical shocks and vibrations, four detector elements 170, 171, 172, 173 positioned two by two on opposite sides of the plane of masses 106 may be provided, as shown in FIG. 1.

Let us look closer to a detector element 170 positioned to the side of the first seismic mass 100. The detector element 170 may include an in-plane detection comb 174 that comprises a stator 176 and a rotor 175. The stator 176 may include a stator comb and a stator anchor for anchoring the stator to the other body element. The rotor 175 may include a rotor comb that is attached to the first seismic mass 100 by means of a second spring structure 177. It is noted that any possible comb structure capable of detecting in-plane motion of the seismic mass may be applied for the purpose. The in-plane detection comb 174 may include a linear comb structure, a parallel plate comb structure or a hybrid comb structure applying features of either of them. MEMS comb structures, as such, are well known to a person skilled in the art and will not be discussed in more detail herein.

The second spring structure 177 may be configured to transform the rotary oscillation of the first seismic mass 100 into linear oscillation of the in-plane detection comb 174. In the linear oscillation, a moving part of the in-plane detection comb moves in the plane of masses 106 and in a direction parallel to the common primary axis 120, shown with an arrow in FIG. 1. The second spring structure 177 may include an elongated spring, wherein one end of the elongated spring is connected to the rotor comb of the rotor 175 and the other end to the first seismic mass 100. For the designed transformation, the elongated spring may be configured to be essentially rigid in the direction along its length, and to flex easily in directions perpendicular to its length, here out of the plane of masses 106. This way the elongated spring relays the rotary in-plane secondary movement of the first seismic mass 100 accurately to linear motion of the rotor of the in-plane detection comb 174 for detection, and at the same time enables the rotary oscillation of the first seismic mass 100 about the common primary axis 120. The elongated spring may be implemented, for example, with a meandering spring, as shown in FIG. 1. Other spring types with similar directional rigidity and flexibility, well known to a person skilled in the art, may be applied within the scope. For example, a beam-formed spring may be applied, as well.

In order to improve the transformation of the secondary motion into linear oscillation, the second spring structure 177 may include also a fourth spring assembly 178 that is configured to prevent components of movement of the in-plane detection comb 174 in directions other than the direction parallel to the common primary axis 120. FIG. 1 illustrates an exemplary configuration where the rotor 176 of the in-plane detection comb 174 is patterned into a region and has an elongated rectangular form. The fourth spring assembly 178 may comprise four anchor springs that are configured to couple one corner of the rectangular region of the rotor 176 to another body element, like the substrate. Each of the anchor springs may be essentially rigid in a direction in the plane of masses 106 and perpendicular to the direction of the common primary axis 120, and flexible in a direction in the plane of masses 106 and in the direction of the common primary axis 120. The anchor springs thus rigidly resist in-plane movement of the rotor in other directions than where the detection is designed to take place.

In linear oscillation the whole in-plane detection comb moves equally back and forth in the plane of masses and in a direction parallel to the common primary axis. This provides a maximal capacitance difference from an individual detector element. The linear motion may be detected with different types of combs (linear, parallel plate, or hybrid), which enables more possibility for overall optimization of the gyroscope structure. A linear comb structure is easy to design, and its rectangular form allows better use of planar space of the gyroscope. The suspending spring structures can be simply arranged to very rigidly oppose out-of-plane motion, which significantly improves robustness against unintended effects from the primary motion and external shocks and vibrations.

As discussed above, for differential detection, the first detection means may include four detector elements 170, 171, 172, 173. For a person skilled in the art, implementation of the above principles to configurations the other detector elements 171, 172, 173 is clear based on FIG. 1 and the discussion on the detector element 170. If the surfaces of the seismic masses 100, 102 forming the plane of masses 106 combine into a rectangular form, the detection elements 171, 172, 173 may be positioned parallel to the plane of masses 106, two detection elements 170, 171 on one side of the rectangular form and two detection elements 172, 173 on the opposite side of the rectangular form. In the exemplary configuration of FIG. 1, two detection elements 170, 171 are positioned symmetrically in respect of the common primary axis 120 along one side of the first seismic mass 100, and two detection elements 172, 173 are positioned symmetrically in respect of the common primary axis 120 along one side of the second seismic mass 102. If the common primary axis 120 is considered to divide the plane of masses 106 into two parts, a first detection element 170 and a second detection element 171 may be positioned along the side of the first seismic mass 100, and a third detection element 172 and a fourth detection element 173 along the side of the second seismic mass 102. The first detection element 170 and the third detection element may be opposite to each other in a same part in respect of the common primary axis 120 and the second detection element 171 and the fourth detection element 174 may be opposite to each other in a same part in respect of the common primary axis 120.

Figure 2:
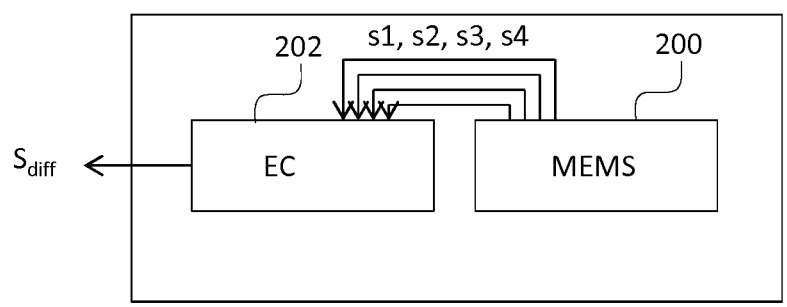
FIG. 2 illustrates elements of a gyroscope that includes the gyroscope structure.

FIG. 2 illustrates elements of a gyroscope that includes a first component 200 and a second component 202. The first component 200 may include the gyroscope structure of FIG. 1, and the second component 202 may include an electrical circuit 202 that is connected to exchange electrical signals with the gyroscope structure. As shown in FIG. 2, signals s1, s2, s3, s4 from each of the four detection elements 170, 171, 172, 173, respectively, may be input to the electrical circuit

202. A differential output signal $S_{diff}$ corresponding to the detected angular motion to be input to the electrical circuit may be calculated from:

$$S_{diff} = (s1+s4) - (s2+s3) \quad (1)$$

i.e. by subtracting a sum of signals from the second detection element 171 and the third detection 173 element from a sum of signals from the first detection element 170 and the fourth detection element 172.

It is understood that external electrical and mechanical interference may induce signal components that are comparable or even larger than signal components from the detected angular motion. These disturbing effects apply, however, similarly to all detection elements of the gyroscope structure, and therefore they become eliminated in the described differential detection scheme. The differential output signal $S_{diff}$ from the electrical circuit thus accurately follows the detected angular motion, even in very demanding operational conditions.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical gyroscope structure, comprising:
    a first seismic mass including a planar surface;
    a second seismic mass including a planar surface;
    a first spring structure for suspending the first seismic mass and the second seismic mass on another body element in a parallel position, wherein the planar surface of the first seismic mass and the planar surface of the second seismic mass form a reference plane of masses;
    excitation means;
    detection means; wherein
    the first spring structure includes a first anchor point within the plane of the first seismic mass for attaching the first seismic mass to the other body element, and a first spring assembly attached to the first anchor point and the first seismic mass, which first spring assembly enables rotary oscillation of the first seismic mass about a first excitation axis that is parallel to the plane of masses;
    the first spring structure includes a second anchor point within the plane of the second seismic mass for attaching the second seismic mass to the other body element, and a second spring assembly attached to the second anchor point and the second seismic mass, which second spring assembly enables rotary oscillation of the second seismic mass about a second excitation axis that is parallel to the plane of masses;
    the first excitation axis and the second excitation axis are aligned to a common primary axis;
    the first spring assembly enables rotary oscillation of the first seismic mass about a first detection axis that is perpendicular to the plane of masses;
    the second spring assembly enables rotary oscillation of the second seismic mass about a second detection axis that is perpendicular to the plane of masses;
    the first detection axis and the second detection axis are separated by a non-zero distance;
    the excitation means are configured to drive the first seismic mass and the second seismic mass to oscillate about the common primary axis;
    the detection means include at least one detector element with an in-plane detection comb and a second spring structure for transforming the rotary oscillation of the first seismic mass or of the second seismic mass into linear oscillation of the in-plane detection comb in the plane of masses in a direction parallel to the common primary axis;
    the detection means are configured to detect the linear oscillation of the in-plane detection comb.

2. The microelectromechanical gyroscope structure of claim 1, wherein the first seismic mass and the second seismic mass are connected by a coupling spring configured to twist along the common primary axis and to bend in the plane of masses.

3. The microelectromechanical gyroscope structure of claim 1, wherein the common primary axis traverses the first anchor point and the second anchor point.

4. The microelectromechanical gyroscope structure of claim 3, wherein the coupling spring is a beam-formed spring extending along the common primary axis between the first seismic mass and the second seismic mass.

5. The microelectromechanical gyroscope structure of claim 1, wherein
    the first anchor point is a region patterned into the first seismic mass, and the first spring assembly includes a first beam-formed spring patterned into the first seismic mass to extend between the first anchor point and the first seismic mass, or
    the second anchor point is a region patterned into the second seismic mass, and the first spring assembly includes a second beam-formed spring patterned into the second seismic mass to extend between the second anchor point and the second seismic mass.

6. The microelectromechanical gyroscope structure of claim 1, wherein the excitation means include a first mass electrode configured to move with the first seismic mass and a second mass electrode configured to move with the second seismic mass, and to interact with an electrode or electrodes attached to the other body element.

7. The microelectromechanical gyroscope structure of claim 6, wherein the first mass electrode or the second mass electrode includes a conducting layer region, patterned onto the surface of the first mass or the second mass, respectively.

8. A microelectromechanical gyroscope structure of claim 1, wherein the excitation means include a third spring structure that is connected to the first seismic mass and to the second seismic mass to couple the rotary oscillation of the first seismic mass and the rotary oscillation of the second seismic mass into anti-phase movement.

9. The microelectromechanical gyroscope structure of claim 8, wherein the common primary axis divides the first seismic mass and the second seismic mass into two parts, and in the anti-phase movement, the coupling is arranged to move a part of the first seismic mass in one side of the common primary axis in one direction, when a part of the second seismic mass in the same side of the common primary axis moves to an opposite direction.

10. The microelectromechanical gyroscope structure of claim 8, wherein the third spring structure includes:
    a third anchor point;
    an essentially rigid beam;
    a third spring assembly that includes a center spring connecting the third anchor point and a centre point of the beam, a first end spring connecting a first end of the beam to the first seismic mass, and a second end spring connecting a second end of the beam to the second seismic mass for coupling the beam to a reciprocated see-saw type of movement according to movement of the first seismic mass and the second seismic mass.

11. The microelectromechanical gyroscope structure of claim 10, wherein the third spring structure is a region patterned into the first seismic mass and the second seismic mass.

12. The microelectromechanical gyroscope structure of claim 10, wherein
the first end spring connecting the first end of the beam to the first seismic mass is configured to be rigid in a direction of the plane of masses to couple movements of the first end of the beam essentially rigidly to the first seismic mass, and to be flexible in the direction perpendicular to the plane of masses to enable the see-saw type of movement of the beam during the rotary oscillation of the first seismic mass; or
the second end spring connecting the second end of the beam to the second seismic mass is configured to be rigid in a direction of the plane of masses to couple movements of the second end of the beam essentially rigidly to the second seismic mass, and to be flexible in the direction perpendicular to the plane of masses to enable the see-saw type of movement of the beam during the rotary oscillation of the second seismic mass.

13. The microelectromechanical gyroscope structure of claim 10, wherein the beam is parallel to the common primary axis.

14. The microelectromechanical gyroscope structure of claim 1, wherein
the detector element includes an in-plane detection comb that comprises a stator comb and a rotor comb;
the second spring structure includes an elongated spring, wherein one end of the elongated spring is connected to the rotor comb and the other end of the elongated spring is connected to the first seismic mass or to the second seismic mass;
the elongated spring is essentially rigid in the direction along its length, and is configured to flex out of the plane of masses to enable the rotary oscillation of the first seismic mass or the second seismic mass about the common primary axis.

15. The microelectromechanical gyroscope structure of claim 14, wherein the elongated spring is a meandering spring.

16. The microelectromechanical gyroscope structure of claim 1, wherein the second spring structure includes also means for preventing components of movement of the in-plane detection comb in directions deviating from the direction parallel to the common primary axis.

17. The microelectromechanical gyroscope structure of claim 16, wherein
the rotor of the in-plane detection comb extends into a region that has an elongated rectangular form;
the second spring structure includes a fourth spring assembly that comprises four anchor springs, each anchor spring configured to couple one corner of the rectangular rotor region to the other body element;
each of the anchor springs is essentially rigid in a direction in the plane of masses and perpendicular to the direction of the common primary axis, and flexes in a direction in the plane of masses and in the direction of the common primary axis.

18. The microelectromechanical gyroscope structure of claim 1, wherein the first detection means include four separate detection elements.

19. The microelectromechanical gyroscope structure of claim 18, wherein
the surface of the first seismic mass and the surface of the second seismic mass forming the plane of masses combine into a rectangular form;
the detection elements are positioned parallel to the plane of masses, two detection elements on one side of the rectangular form and two detection elements on an opposite side of the rectangular form.

20. The microelectromechanical gyroscope structure of claim 19, wherein two detection elements are positioned symmetrically in respect of the common primary axis along one side of the first seismic mass, and two detection elements are positioned symmetrically in respect of the common primary axis along one side of the second seismic mass.

21. The microelectromechanical gyroscope structure of claim 20, wherein
the common primary axis divides the plane of masses into two parts;
a first detection element and a second detection element are positioned along the side of the first seismic mass,
a third detection element and a fourth detection element are positioned along the side of the second seismic mass,
the first detection element and the third detection element are in a same part in respect of the common primary axis.

22. The gyroscope that includes a microelectromechanical gyroscope structure of claim 1, and an electrical circuit connected receive electrical signals from the microelectromechanical structure.

23. The gyroscope of claim 22, wherein
the electrical circuit is configured to receive first signals from the first detection element, second signals from the second detection element, third signals from the third detection element, and fourth signals from the fourth detection element;
the electrical circuit is configured to receive a differential input signal as a simultaneous combination of a first signal, a second signal, a third signal and a fourth signal.

24. The gyroscope of claim 23, wherein the combination is formed by subtracting a sum of signals from the second detection element and the third detection element from a sum of signals from the first detection element and the fourth detection element.

* * * * *